(12) United States Patent
Huang

(10) Patent No.: US 6,720,219 B2
(45) Date of Patent: Apr. 13, 2004

(54) SPLIT GATE FLASH MEMORY AND FORMATION METHOD THEREOF

(75) Inventor: Tsai-Yu Huang, Hsinchu Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/295,298

(22) Filed: Nov. 15, 2002

(65) Prior Publication Data

US 2003/0186506 A1 Oct. 2, 2003

(30) Foreign Application Priority Data

Mar. 26, 2002 (TW) ........................................ 91105948 A

(51) Int. Cl.[7] ............................................ H01L 21/336
(52) U.S. Cl. ........................ 438/264; 438/257; 438/259; 438/304
(58) Field of Search ................. 438/259, 257, 438/258, 260–267, 304, 596; 257/314, 315, 316–321

(56) References Cited

U.S. PATENT DOCUMENTS

| | | | | |
|---|---|---|---|---|
| 5,495,441 A | * | 2/1996 | Hong | 365/185.01 |
| 5,703,387 A | * | 12/1997 | Hong | 257/315 |
| 6,130,453 A | * | 10/2000 | Mei et al. | 257/315 |
| 6,159,801 A | * | 12/2000 | Hsieh et al. | 438/259 |
| 6,391,719 B1 | * | 5/2002 | Lin et al. | 438/259 |
| 6,538,275 B2 | * | 3/2003 | Sugiyama et al. | 257/314 |
| 6,570,213 B1 | * | 5/2003 | Wu | 257/315 |
| 6,580,116 B2 | * | 6/2003 | Ogura | 257/314 |
| 6,593,187 B1 | * | 7/2003 | Hsieh | 438/257 |
| 6,635,533 B1 | * | 10/2003 | Chang et al. | 438/259 |

* cited by examiner

Primary Examiner—Michael S. Lebentritt
(74) Attorney, Agent, or Firm—Nelson A. Quintero

(57) ABSTRACT

A split gate flash memory. A drain is disposed in the bottom of a trench formed in a substrate. A source is disposed in the substrate outside the trench. A striped floating gate is disposed at a sidewall of the trench, wherein one side of the striped floating gate is near the bottom of the trench, and the other side of the striped floating gate protrudes above the substrate. A control gate winds along the floating gate, wherein one side of the control gate is near the bottom of the trench, and the other side of the control gate in outside the trench. A metal bit line connects to the drain.

16 Claims, 5 Drawing Sheets

SPLIT GATE FLASH MEMORY AND FORMATION METHOD THEREOF

BACKGROUND OF THE INVENTION

1. Field of the Invention

The present invention relates in general to a structure and fabricating method for semiconductor memory. In particular, the present invention relates to a structure and fabricating method for split gate flash memory.

2. Description of the Related Art

A flash memory device is a non-volatile memory, derived from erasable programmable read-only memory (EPROM) and electrically-erasable programmable read-only memory (EEPROM). Flash memory is being increasingly used to store execution codes and data in portable electronic products, such as computer systems.

A typical flash memory comprises a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Stacked-gate and split-gate types are typically used in the memory cell structures of the flash memory.

Since the stacked-gate type memory cell structure is the same as the standard memory cell structure of the EPROM, it is advantageous for size reduction. However, there is a disadvantage in that the operational characteristics of the flash deteriorate during an erase operation due to overerase.

The split gate flash memory, in which the control gate includes a first portion overlaying a floating gate and a second portion directly overlaying the channel, is not susceptible to overerase problems. However, the size of the split gate flash memory cell is not small enough to achieve sufficiently reduced production costs.

SUMMARY OF THE INVENTION

The object of the present invention is to provide a structure and fabrication method for split gate flash memory with reduced size.

The present invention provides a method for forming a split gate flash memory. A substrate having a pad oxide layer and a pad nitride layer thereon is provided. A trench is formed in the substrate, the pad oxide layer and the pad nitride layer. First type dopants are implanted in the bottom of the trench to form a drain in the substrate. A first oxide layer is formed on the bottom and sidewall of the trench. A first polysilicon layer is formed on the sidewall of the trench to function as a floating gate. A second oxide layer is conformally formed in the trench on the first polysilicon layer and the first oxide layer. The pad nitride layer is removed to expose the pad oxide layer. The pad oxide layer is removed to expose the substrate. A third oxide layer is conformally formed. A second polysilicon layer is conformally formed on the third oxide layer. A first nitride layer is conformally formed on the second polysilicon layer. A fourth oxide layer is formed on the first nitride layer. A part of the fourth oxide layer is removed by CMP using the first nitride layer as a stop layer to expose a top, approximately horizontal surface of the first nitride layer. The first nitride layer is etched to expose a top, approximately horizontal surface of the second polysilicon layer. The other part of the fourth oxide layer is removed. A fifth oxide layer is formed on the top surface of the second polysilicon layer. The first nitride layer and the second polysilicon layer not protected by the fifth oxide layer are removed to expose the third oxide layer, thereby defining the second polysilicon layer to function as a control gate. First type dopants are implanted in the substrate to form a source outside the trench. A dielectric layer is formed on the third oxide layer, the fifth oxide layer and the control gate. A bit line is formed on the dielectric layer connecting to the drain.

The present invention provides a split gate flash memory. A drain is disposed in the bottom of a trench formed in a substrate. A source is disposed in the substrate outside the trench. A striped floating gate is disposed at a sidewall of the trench, wherein one side of the striped floating gate is near the bottom of the trench, and the other side of the striped floating gate protrudes above the substrate. A control gate winds along the floating gate, wherein one side of the control gate is near the bottom of the trench, and the other side of the control gate is outside the trench. A metal bit line connects to the drain.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 1–9 are cross sections showing a method for forming a split gate flash memory according to the present invention.

Figure 1:
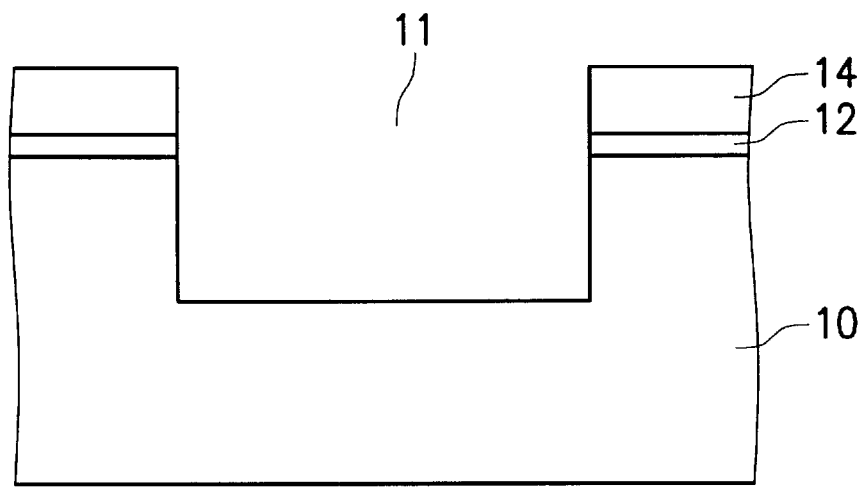
FIGS. 1–9 are cross sections showing a method for forming a split gate flash memory according to the present invention.

As shown in FIG. 1, a substrate 10 is provided. A pad oxide layer 12 and a pad nitride layer 14 are sequentially formed on the substrate 10. A trench 11 is formed in the pad nitride layer 14, the pad oxide layer 12 and the substrate 10. The thickness of the pad oxide layer 12 is about 80 Å, and the depth of the trench 11 from the surface of the substrate 10 to the bottom of the trench 11 is about 0.25 µm.

Figure 2:
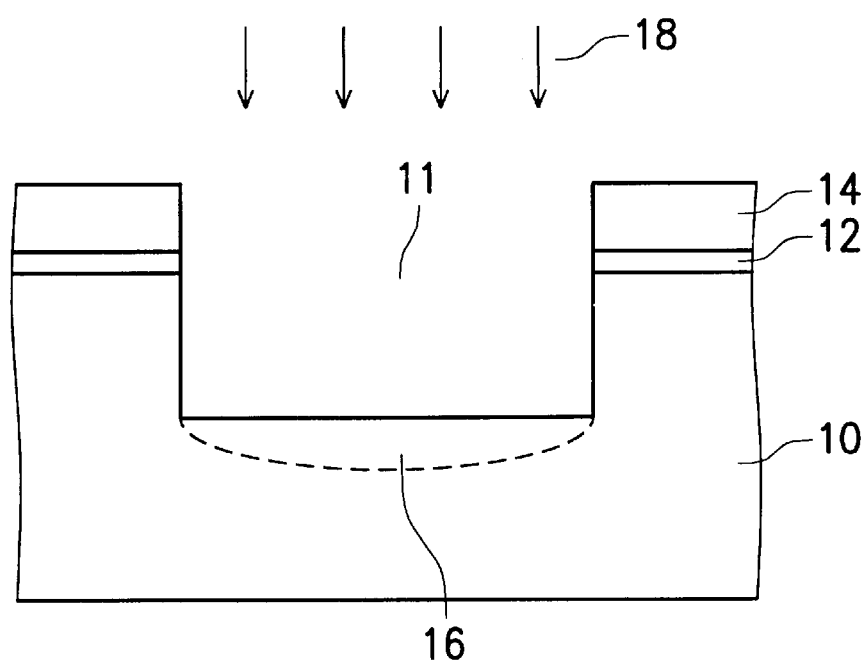

As shown in FIG. 2, an implantation process 18 is carried out with n-type dopants, such as arsenic ions (As ions), to the bottom of the trench 11 to form a drain 16 in the substrate 10. After implantation process 18, another implantation process is carried out at 45° with p-type dopants, such as boron ions (not shown), to form a channel in the sidewall of the trench 11.

Figure 3:
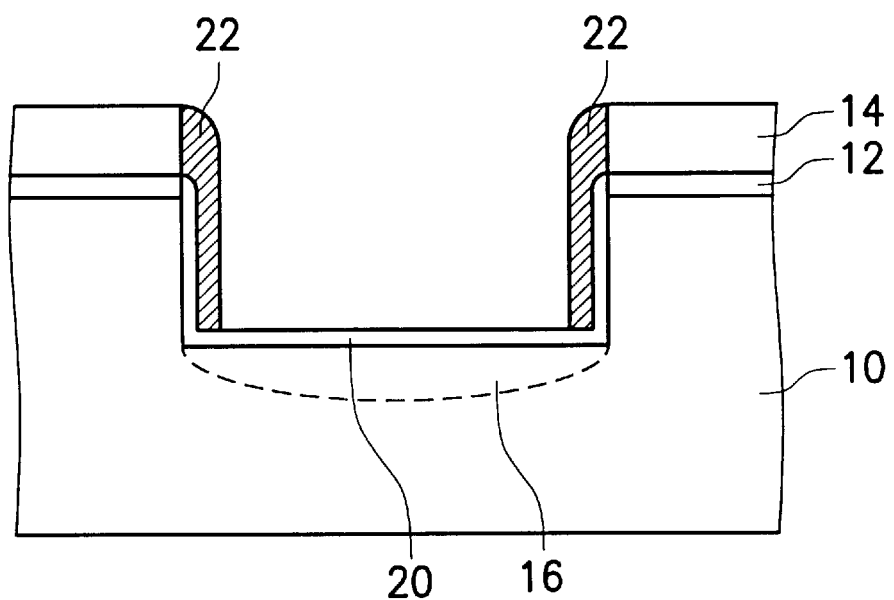

As shown in FIG. 3, a first oxide layer 20 is conformally formed on the bottom and sidewall of the trench 11 by, for example, thermal oxidation. The first oxide layer may not be formed on the sidewall of the pad nitride layer 14. A first polysilicon layer 22 is formed on the sidewall of the trench 11 to form a floating gate. The striped first polysilicon layer 22 parallel to the sidewall of the trench 11 protrudes above the horizontal surface of the substrate 10.

Figure 4:
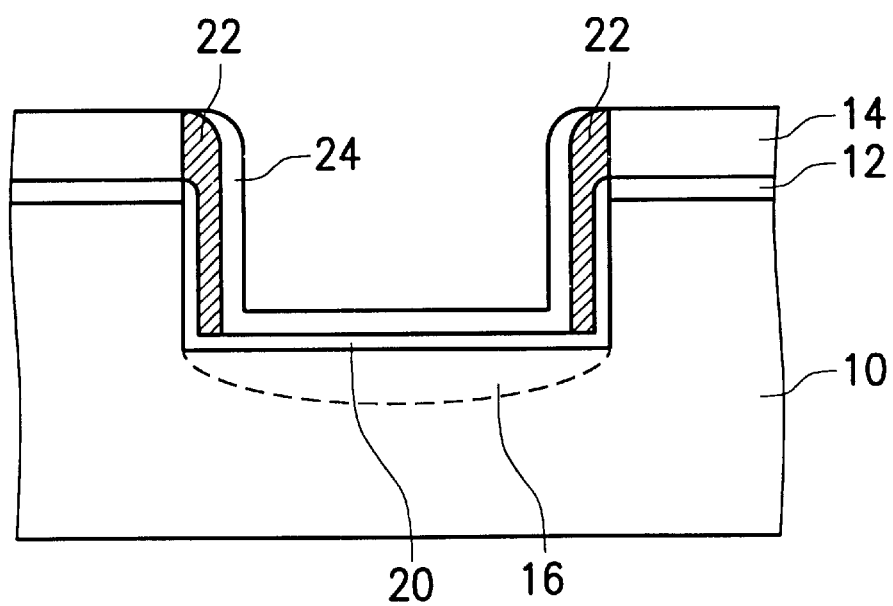

As shown in FIG. 4, a second oxide layer 24 is conformally formed with a thickness of about 650 Å on the whole substrate 10. A part of the second oxide layer 24 is then removed by chemical mechanical polishing (CMP) using the pad nitride layer 14 as a stop layer, therefore the result second oxide layer 24 is formed in the trench 11 covering the first polysilicon layer 22 and the first oxide layer conformally.

Figure 5:
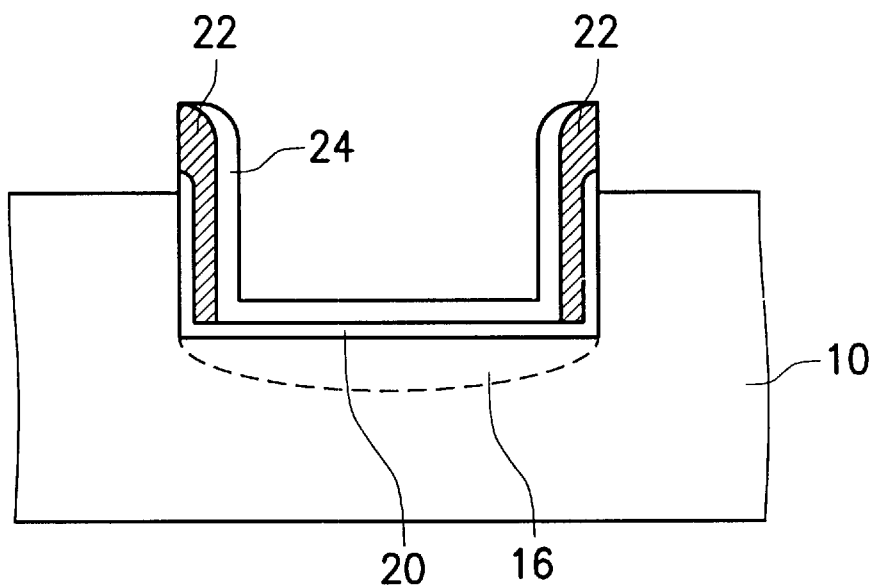

As shown in FIG. 5, the pad nitride layer 14 is removed by, for example, wet etching. An implantation process (not shown) is then executed with p-type dopants, such as boron ions (B ions). After the implantation process, the pad oxide layer 12 is removed. In this step, some second oxide layer 24, the same material as the pad oxide layer 12, may be lost, but it does not affect the present invention.

Figure 6:
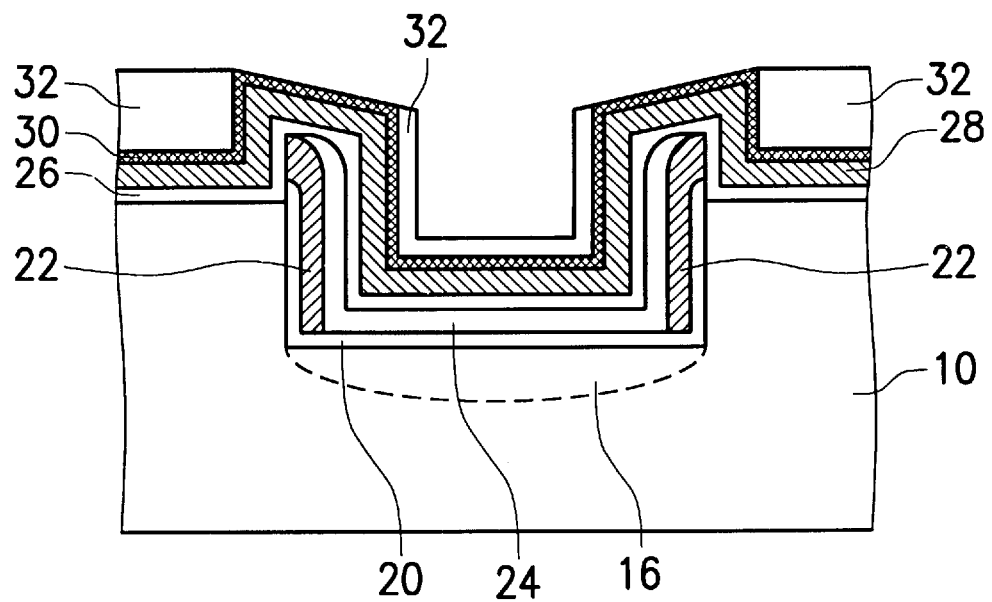

As shown in FIG. 6, a third oxide layer 26 is conformally formed with a thickness between about 80 Å and about 150 Å on the substrate 10, the first polysilicon layer 22 and the second oxide layer 24. A second polysilicon layer 28 is then conformally formed on the third oxide layer 26 with a thickness of about 1000 Å. A first nitride layer 30 is conformally formed on the second polysilicon layer 28 with a thickness of about 150 Å. A fourth oxide layer 32 is formed on the first nitride layer 30 with a thickness of about 800 Å. A part of the fourth oxide layer 32 is removed by chemical mechanical polishing (CMP) using the first nitride layer 30 corresponding to the protruding portion of the first polysilicon layer (i.e. floating gate) 22 as a stop layer to expose the top surface of the first nitride layer 30. The top surface of the first nitride layer 30 here means the approximately horizontal surface of the first nitride layer 30 corresponding to the protruding portion of the first polysilicon layer (i.e. floating gate) 22.

Figure 7:
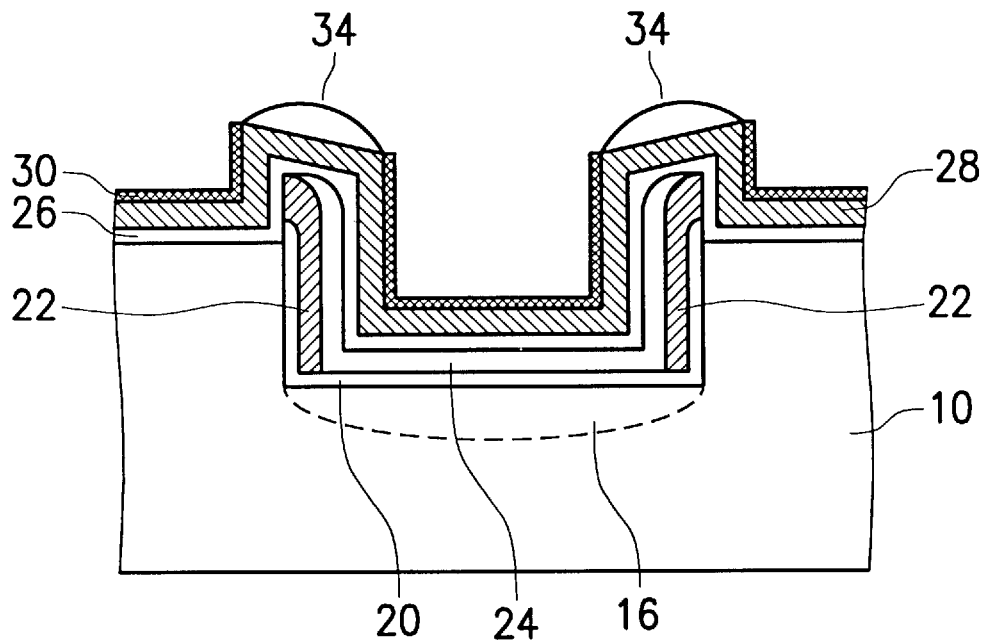

As shown in FIG. 7, the exposed, top first nitride layer 30 is removed by etching to expose the top surface of the second polysilicon layer 28, the extruding portion. The remained fourth oxide layer 32 is removed to expose the first nitride layer 30, and the exposed second polysilicon layer 28 is oxidized to form a fifth oxide layer 34 with a thickness of about 100 Å on the top surface of the second polysilicon layer 28.

Figure 8:
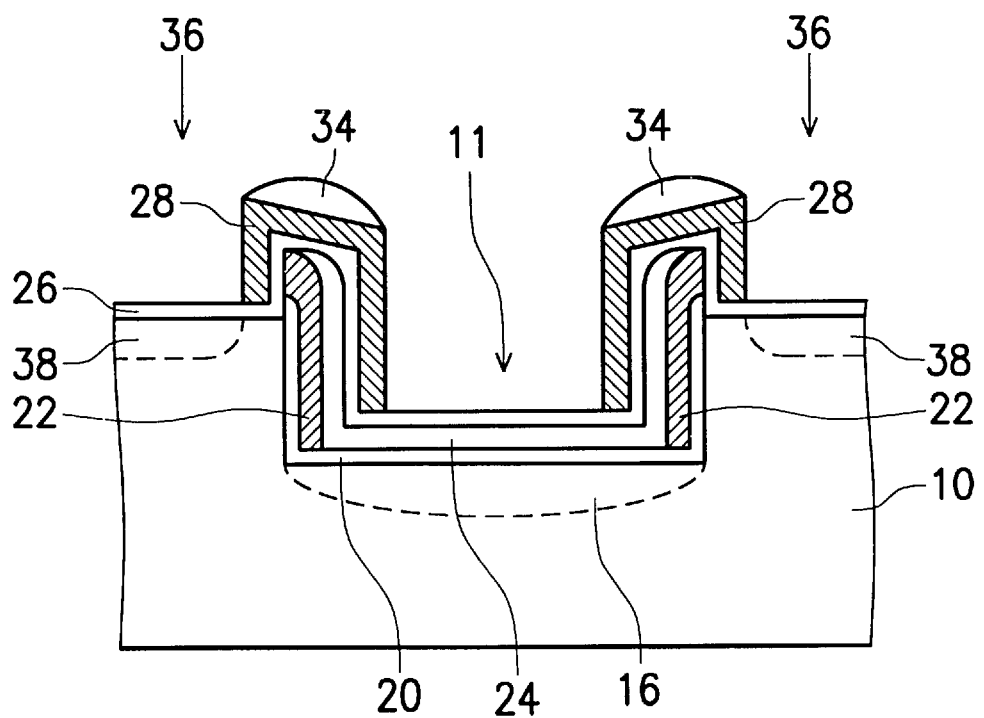

As shown in FIG. 8, the first nitride layer 30 and the second polysilicon layer 28 unprotected by the fifth oxide layer 34 are removed by anisotropic etching using the fifth oxide layer 34 as a mask. The third oxide layer 26 disposed in the horizontal level is then exposed. An implantation process 36 is carried out with n-type dopants, such as arsenic ions (As ions), into the substrate 10 to form a source 38 outside the trench 11.

Figure 9:
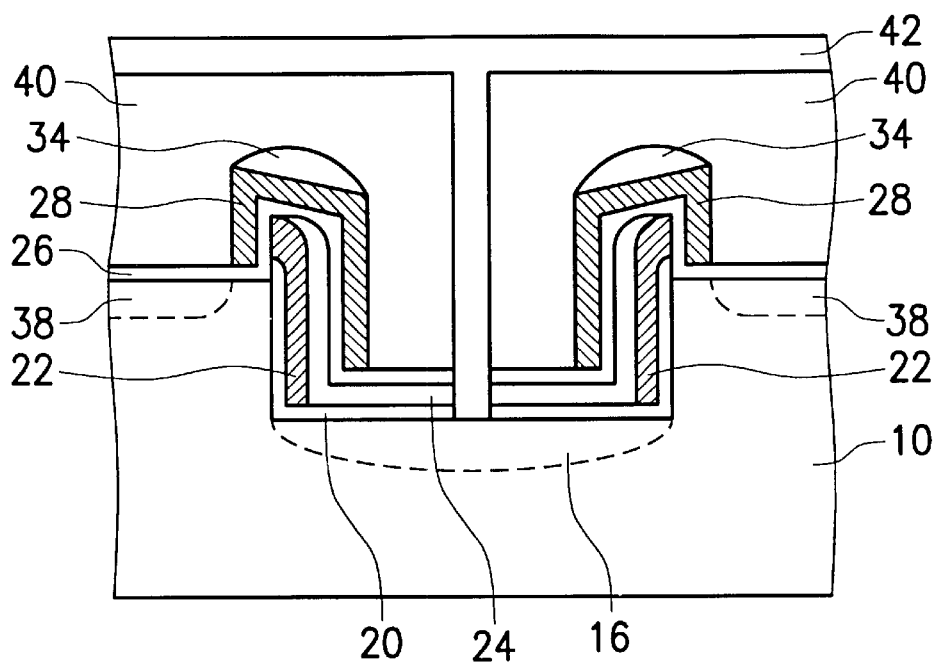

As shown in FIG. 9, a blanket dielectric layer 40 is formed on the third oxide layer 26, the second polysilicon layer 28 and the fifth oxide layer 34. A bit line 42 is formed on the dielectric layer 40 and connects the drain 16 through the dielectric layer 40, the third oxide layer 26, the second oxide layer 24 and the first oxide layer 20.

Figure 10:
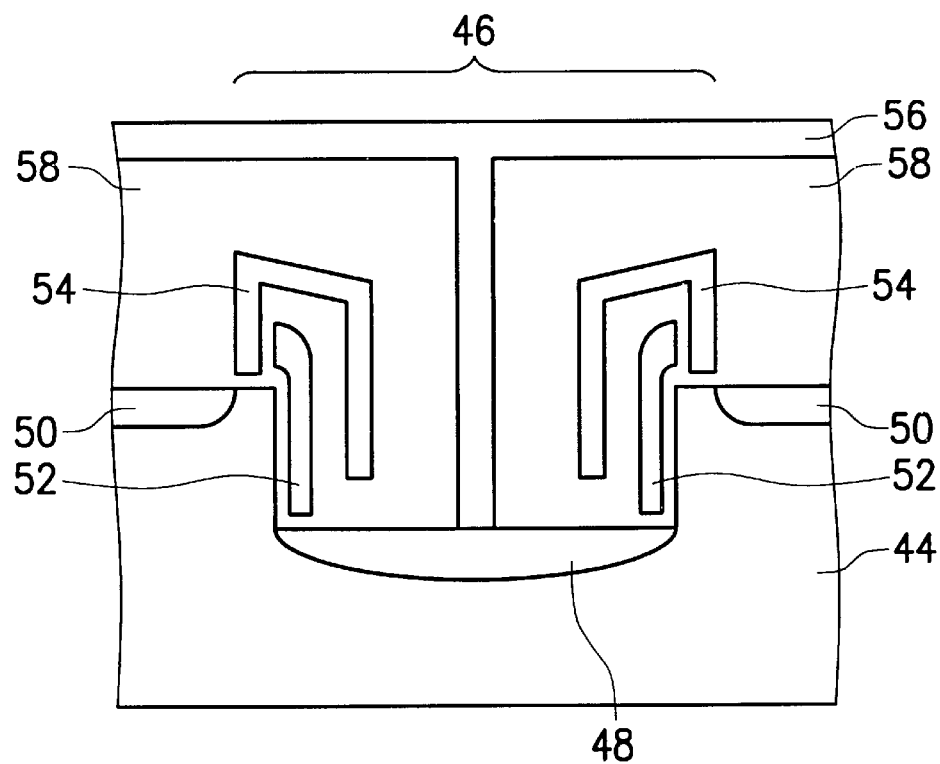
FIG. 10 is cross section showing a split gate flash memory according to the present invention.

The present invention also provides a structure of a split gate flash memory, as shown in FIG. 10. A substrate 44 with a trench 46 therein is provided. A drain 48 is disposed in the bottom of the trench 46. A source 50 is formed in the substrate 44 outside the trench 46. A striped floating gate 52 is disposed on the sidewall of the trench 46. One side of the striped floating gate 52 is located near the bottom of the trench 46, and the other side of the striped floating gate 52 protrudes above the substrate 44. A control gate 54 winds along the striped floating gate 52. One side of the control gate 54 is located near the bottom of the trench 46, and the other side is located outside the trench 46. The striped floating gate 52 is disposed between the control gate 54 and the substrate 44. The floating gate 52, the control gate 54 and the substrate 44 are surrounded by an oxide layer 58 and isolated from each other. A metal bit line 56 disposed on the oxide layer 58 connects to the drain 48.

Therefore, minimization of the split gate flash memory is achieved by the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a split gate flash memory, comprising:

providing a substrate having a pad oxide layer and a pad nitride layer thereon;

forming a trench in the substrate, the pad oxide layer and the pad nitride layer;

implanting first type dopants in the bottom of the trench to form a drain in the substrate;

forming a first oxide layer on the bottom and sidewall of the trench;

forming a first polysilicon layer on the sidewall of the trench, to serve as a floating gate;

conformally forming a second oxide layer in the trench covering the first polysilicon layer and the first oxide layer;

removing the pad nitride layer to expose the pad oxide layer;

removing the pad oxide layer to expose the substrate;

conformally forming a third oxide layer on the substrate and the second oxide layer;

conformally forming a second polysilicon layer on the third oxide layer;

conformally forming a first nitride layer on the second polysilicon layer;

forming a fourth oxide layer on the first nitride layer;

removing a part of the fourth oxide layer by CMP using the first nitride layer as a stop layer to expose a top, approximately horizontal surface of the first nitride layer;

etching the first nitride layer to expose a top, approximately horizontal surface of the second polysilicon layer;

removing the other part of the fourth oxide layer;

forming a fifth oxide layer on the top surface of the second polysilicon layer;

removing the first nitride layer and the second polysilicon layer not protected by the fifth oxide layer to expose the third oxide layer, thereby defining the second polysilicon layer to function as a control gate;

implanting first type dopants in the substrate to form a source outside the trench;

forming a dielectric layer on the third oxide layer, the fifth oxide layer and the control gate; and forming a bit line on the dielectric layer connecting to the drain.

2. The method as claimed in claim 1, wherein the thickness of the pad oxide layer is about 80 Å.

3. The method as claimed in claim 1, wherein the thickness of the depth of the trench from the surface of the substrate to the bottom of the trench is about 0.05 µm.

4. The method as claimed in claim 1, wherein the dopants used to form the drain are arsenic ions.

5. The method as claimed in claim 1, wherein after implanting first type dopants to form the drain, second type dopants are implanted at 45° to form a channel in the sidewall of the trench, wherein the second type dopants are boron ions.

6. The method as claimed in claim 1, wherein the thickness of the second oxide layer is about 650 Å.

7. The method as claimed in claim 1, wherein after removing the pad nitride layer and before removing the pad oxide layer, second type dopants are implanted to the substrate, wherein the second type dopants are boron ions.

8. The method as claimed in claim 1, wherein the thickness of the third oxide layer is about 80~150 Å.

9. The method as claimed in claim 1, wherein the thickness of the second polysilicon layer is about 1000 Å.

10. The method as claimed in claim 1, wherein the thickness of the first nitride layer is about 150 Å.

11. The method as claimed in claim 1, wherein the thickness of the fourth oxide layer is about 800 Å.

12. The method as claimed in claim 1, wherein the thickness of the fifth oxide layer is about 100 Å.

13. The method as claimed in claim 1, wherein the dopants used to form the source are arsenic ions.

14. A method for forming a split gate flash memory, comprising:

providing a substrate having a pad oxide layer and a pad nitride layer thereon;

forming a trench in the substrate, the pad oxide layer and the pad nitride layer;

forming a drain in the bottom of the trench;

forming a first oxide layer on the bottom and sidewall of the trench;

forming a striped floating gate on the sidewall of the trench, wherein one side of the striped floating gate is near the bottom of the trench, and the other side of the striped floating gate protrudes above the substrate;

conformally forming a second oxide layer in the trench on the first polysilicon layer;

removing the pad nitride layer and the pad oxide layer to expose the substrate;

conformally forming a third oxide layer on the substrate and the second oxide layer;

forming a control gate winding along the floating gate on the third oxide layer, wherein one side of the control gate is near the bottom of the trench, and the other side of the control gate is outside the trench;

forming a source outside the trench;

forming a dielectric layer on the third oxide layer and the control gate; and forming a bit line on the dielectric layer connecting to the drain.

15. The method as claimed in claim 14, wherein the method of forming the control gate comprises:

conformally forming a second polysilicon layer on the third oxide layer;

conformally forming a first nitride layer on the second polysilicon layer;

forming a fourth oxide layer on the first nitride layer;

removing a part of the fourth oxide layer by CMP to expose a top surface of the first nitride layer corresponding to the floating gate;

etching the first nitride layer to expose a top surface of the second polysilicon layer corresponding to the floating gate;

removing the other part of the fourth oxide layer;

forming a fifth oxide layer on the top surface of the second polysilicon layer: and removing the first nitride layer and the second polysilicon layer not protected by the fifth oxide layer to expose the third oxide layer, thereby defining the second polysilicon layer to function as the control gate.

16. The method as claimed in claim 14, wherein the thickness of the depth of the trench from the surface of the substrate to the bottom of the trench is about 0.05 µm.

* * * * *